(12) United States Patent
Seok et al.

(10) Patent No.: US 6,759,269 B2
(45) Date of Patent: Jul. 6, 2004

(54) METHOD FOR FABRICATING AL-SI ALLOY PACKAGING MATERIAL

(75) Inventors: Hyun-Kwang Seok, Seoul (KR); Jae-Chul Lee, Seoul (KR); Ho-In Lee, Seoul (KR); Jin-Kook Yoon, Seoul (KR); Ji-Young Byun, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 10/285,465

(22) Filed: Nov. 1, 2002

(65) Prior Publication Data

US 2003/0129786 A1 Jul. 10, 2003

(30) Foreign Application Priority Data

Nov. 1, 2001 (KR) ................................. 67891

(51) Int. Cl.[7] .......................... H01L 21/44; H01L 21/48; H01L 21/50
(52) U.S. Cl. ........................................ 438/106; 438/127
(58) Field of Search ........................ 438/106, 125–127, 438/800

(56) References Cited

U.S. PATENT DOCUMENTS 6,312,535 B1 * 11/2001 Leatham et al. ............ 148/442

OTHER PUBLICATIONS

MSFC–388 Material Properties Data Sheet<<http://technology.rti.org/pdf/toas/nasa388alloy.pdf>> Apr. 20, 2001 (visited Jun. 30, 2003).*
MSFC–398 Materials Properties Data Sheet<<http://technology.rti.org/pdf/toas/nasa398alloy.pdf>> Apr. 20, 2001 (visited Jun. 30, 2003).*
"New Alloy Promises Lower Emission in High–Performace Engines" ASM Newsletter Achive, vol. 2. Issue 38. Oct. 8, 2002<<http://www.asm–intl.org/content/NavigationMenu/News/ASM_eNews/Newsletter Archive/issue38_2002.htm>> (visited Jun. 29, 2003).*
"Self Assembled Fabrication of Aluminum–Silicon Nanowire Networks" Paulose et al. Applied Physics Letters. vol. 81, No. 1, Jul. 1, 2002, >> http://www.ee.psu.edu/grimes/publications/APL–Al–nanowires.pdf<<(visited Jun. 29, 2003).*

* cited by examiner

*Primary Examiner*—Craig A. Thompson
(74) *Attorney, Agent, or Firm*—Dickstein, Shapiro, Morin & Oshinsky, LLP.

(57) ABSTRACT

In a method for fabricating a Si—Al alloy packaging material, by adding Al—Si alloy powders to Si powders and pressurizing-forming it, or by pressurizing-filling Si powders or a preforming body of Si powders with Al—Si alloy melt, a Si—Al alloy packaging material having good characteristics can be obtained.

12 Claims, 9 Drawing Sheets

13 white : Al, black : Si     50μm white ; Al, black ; Si    50 μ

METHOD FOR FABRICATING AL-SI ALLOY PACKAGING MATERIAL

BACKGROUND OF THE INVENTION

1. Field of the Invention

The present invention relates to a method for fabricating a Al—Si alloy packaging material for semiconductor device, and in more particular to a method for fabricating an Al—Si alloy packaging material which is capable of increasing Si content by mixing Si powders with Al—Si powders and pressurizing-forming the mixture or by pressurizing-filling Si powders or a preforming body of Si powders with Al—Si alloy melt.

2. Description of the Prior Art

A packaging material for semiconductor device means a material fabricated as a box-shaped body in order to protect a semiconductor device disposed therein. In general, a package is largely divided into a homogeneous package and a heterogeneous package.

FIG. 1a illustrates a homogeneous package consisting of a base 1, a side-wall 2 and a lid 3. Herein, a feedthrough 4 is arranged between the base and the side-wall 2, and semiconductor substance 5 is disposed in the package. FIG. 1b illustrates a heterogeneous package fabricated by joining the base 1, the side-walls 2 and the lid 3, herein, feedthrough 4 is formed on the sidewalls 2.

There are required characteristics for a packaging material for semiconductor device.

First, a packaging material has to have a thermal expansive coefficient similar to that of a semiconductor device. In more detail, when the semiconductor device is operated, heat is generated, and accordingly a temperature of the semiconductor and the package rises, herein, if they have different thermal expansive coefficients, the semiconductor device may be dissected from the package.

In addition, it is preferable for the packaging material to have a high heat transfer modulus. When the packaging material has a high heat conductivity, heat generated in the operation of the semiconductor device can be quickly emitted to the outside, and accordingly it is advantageous in maintaining performance of the semiconductor device.

The lighter the packaging material, the more it is advantageous. By using the packaging material having a low density, a weight of electronic appliance can be reduced, and accordingly mobility of electronic appliance can be improved.

The packaging material is required to have a good processability. In more detail, in order to fabricate an intricate package or a package required to have a precise measure tolerance, the packaging material having a good processability has to be used.

In addition, the packaging material is required to have a good plating characteristic. If a surface of the packaging material is plated with nickel, copper, silver and gold, etc. by an electroplating method and the joining between the packaging and the plating layer is strong, a life-span of the packaging can be improved.

Besides the above-mentioned characteristics, it is preferable to use a packaging material having a good bonding characteristic. In joining of the base, the side-walls and the lid, by using a material having a good bonding characteristic, a life-span and bonding characteristics of the packaging can be improved. Herein, the base, the side-walls and the lid are fabricated with the same material or different materials, and welding or soldering or adhesion agent can be used to join the construction parts.

Lastly, it is required for the packaging material to have a simple fabrication process and low production cost.

Various packaging materials having all those characteristics have been developed, among them typical packaging materials will be described with reference to following table 1.

TABLE 1

| Material | Thermal expansive coefficient | Heat conductivity W/mK | Density × $10^3$ kg/m$^3$ |
|---|---|---|---|
| Kovar | 5.8 | 17 | 8.2 |
| Titanium | 5.6 | 15 | 4.5 |
| Aluminum | 23.6 | 171 | 2.7 |
| Copper | 17.6 | 391 | 8.9 |
| Copper-85 tungsten | 7.0 | 226 | 16.4 |
| Molybdenum | 5.1 | 140 | 10.2 |
| Alumina | 6.3 | 29 | 3.9 |
| Beryllia | 7.2 | 260 | 2.9 |
| Aluminum nitride | 5.3 | 180 | 3.3 |
| Diamond | −2 | >1000 | 3.0 |
| Aluminum-63 silicon carbide | 8.2 | 158 | 3.0 |
| Aluminium-70 silicon | 6.8 | 140 | 2.5 |

The above-mentioned packaging materials respectively have merits and demerits. For example, kovar has an appropriate thermal expansive coefficient, however, its heat conductivity is low and a density is high. Titanium has a good thermal expansive coefficient and a low density, however, it has low heat conductivity and is expensive. Aluminum has an appropriate heat conductivity and a low density for a packaging material, however, because it has a high thermal expansive coefficient, its usage for a packaging material is restricted. Beryllia and diamond respectively have a low thermal expansive coefficient, a high high heat conductivity and a low density, however, they are excessively expensive.

In the meantime, a metal matrix composite fabricated by adding a stiffening agent such as SiC, $B_4N_3$ and $Al_2O_3$, etc. to a metal material such as aluminum, etc. shows good characteristics as a packaging material in several aspects such as a thermal expansive coefficient, a heat conductivity, a density and a price, etc.

FIG. 2 illustrates a pressureless infiltration method as one of typical methods for fabricating Al—SiC one of metal matrix composites. In the pressureless infiltration method, in order to make metal melt 8 easily penetrate into a preforming SiC body 7, a certain processes are required. In more detail, in order to improve a wetability of ceramic to the metal melt, a coating layer such as oxide, etc. is formed onto the ceramic surface or a chemical reaction between the melt and the ceramic surface is induced by using a special bonding agent. Afterward, the melt can easily penetrate into the preforming ceramic body. However, the above-described method is intricate. In addition, ceramic has bad processing characteristics.

In the meantime, in consideration of a thermal expansive coefficient, a heat conductivity and a density, etc., Si-30 wt % Al alloy is appropriate for a packaging material. In addition, its material cost, processability and bondingability are good, its application range will be gradually expanded.

Recently, a method for fabricating Al—Si alloy having the content of Si in the range of 50~70% by total weight of Al—Si alloy with a low cost has been developed in the U.K. FIG. 3 illustrates the conventional method for fabricating an Al—Si alloy packaging material. In the method, by fabricating preforming alloy Al—Si melt 9, spraying it as liquid 10 having a 50 micron~200 micron size by using high pressure gas such as high pressure nitrogen and argon, etc., the alloy having a billet shape, etc. is formed onto a substrate moving rotatively and horizontally. After cuffing the formed Al—Si alloy body 11 so as to have a certain width, a hydrostatic press process (HIP, process for eliminating internal air holes), a mechanical process, a plating process, a semiconductor device adhesion process, and a packaging sealing process, etc. are sequentially performed. FIG. 4 is an enlarged photograph of the Al-70Si alloy fabricated by a spray forming method of OSPREY company in the U.K. taken with an electronic microscope ZEISS Axioskip (Germany).

However, the conventional method has following demerits. In the conventional method, a temperature of the melt has to be not less than 1000° C., in cutting of the formed body and fabricating it as a certain package box, material loss occurs, and accordingly a fabrication cost is increased. In more detail, in fabricating of Al—Si packaging material by the conventional spray forming method, because the more the Si content, the higher a temperature of Al—Si melt has to be risen, there is lots of energy loss. In addition, because the spray-fabricated Al—Si alloy body has to be cut again to have a request size, lots of material and time loss occur.

SUMMARY OF THE INVENTION

In order to solve the above-mentioned problems, it is an object of the present invention to provide a method for fabricating an Al—Si packaging material which is capable of simplifying fabrication processes and lowering a production cost in comparison with the conventional Al—Si fabrication method by mixing Si powders with Al—Si alloy powders and filling the mixture as a request size from beginning.

It is another object of the present invention to provide a method for fabricating an Al—Si packaging material which is capable of fabricating an Al—Si alloy material having lots of Si content by easily adjusting the Si content in fabrication.

In addition, it is yet another object of the present invention to provide a method for fabricating an Al—Si packaging material which is capable of reducing internal air holes and performing full filling without using outer big stress by mixing-filling Al—Si alloy powders having a high temperature flowability with Si powders not having plastic deformation characteristic.

In addition, it is still another object of the present invention to provide a method for fabricating an Al—Si packaging material having different Si content in the thickness direction by differentiating a mixing proportion of Si of each or both Si powders and Al—Si alloy powders.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Hereinafter, a method for fabricating an Al—Si alloy packaging material of a semiconductor device by mixing Si powders with Al—Si powders and pressurizing-forming the mixture will be described.

In the present invention, it is preferable for an Al—Si packaging material to have Si content as 40~90% by weight thereof. When a Si content is below 40 wt %, heat expansive coefficient difference between Si group and Ga—As group is very large, and accordingly adhesive characteristic is bad. When Si content is greater than 90 wt %, because strength of the packaging material is low, it may be easily damaged by outer impacts. In addition, it is difficult to perform powder forming, and internal air holes may be formed.

Si content in an Al—Si alloy packaging material can be calculated by using following equation.

When Si powders is X wt %, Al—Si alloy powders is (100–X)wt % and Si content in Al—Si alloy powders is x wt %, total content of Si in a mixture of the Si powders and the Al—Si powders can be calculated as below.

$$\text{Total Si content \%} = X + \frac{x(100 - X)}{100}$$

Herein, by adjusting composition of the Al—Si alloy powders and a mixing proportion between the Si powders and the alloy powders, total Si content can be adjusted. For example, when Si powders and Al-50 wt % Si alloy powders are mixed as a ratio of 60:40, total Si content is {60+50(40)/100}%=80%.

Figure 1A:
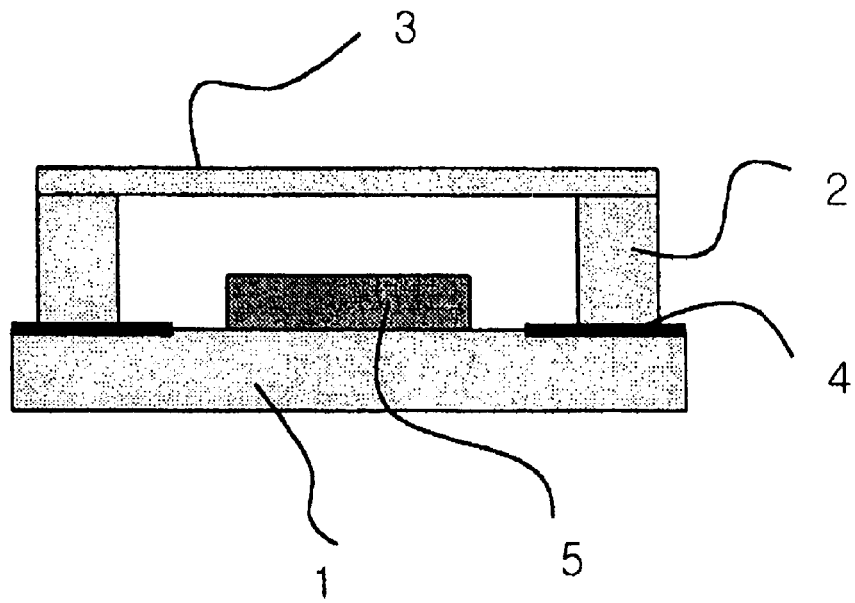
FIGS. 1a and 1b respectively illustrate a general packaging shape.
Figure 1B:
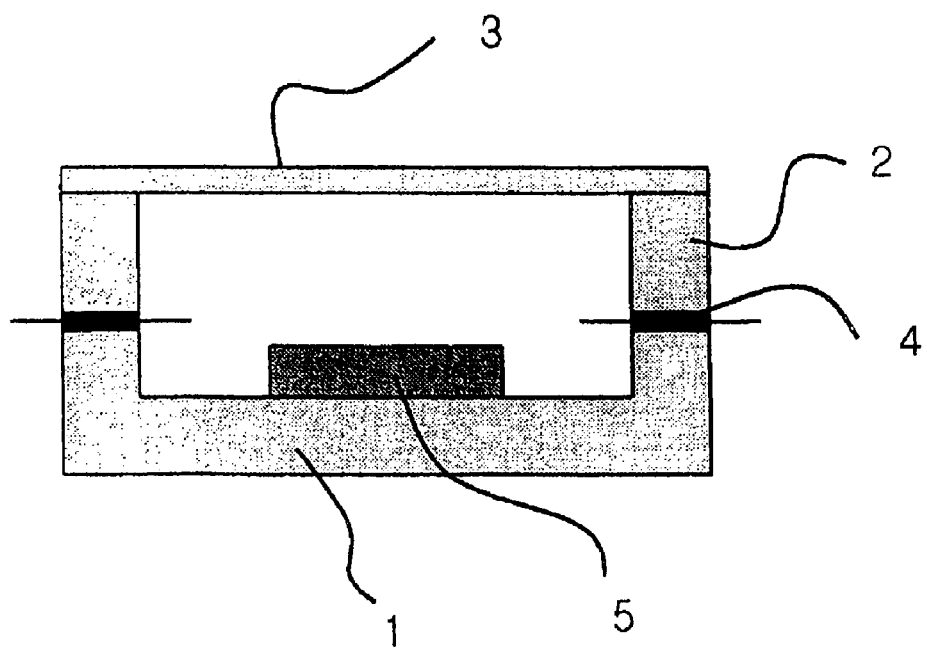
Figure 2:
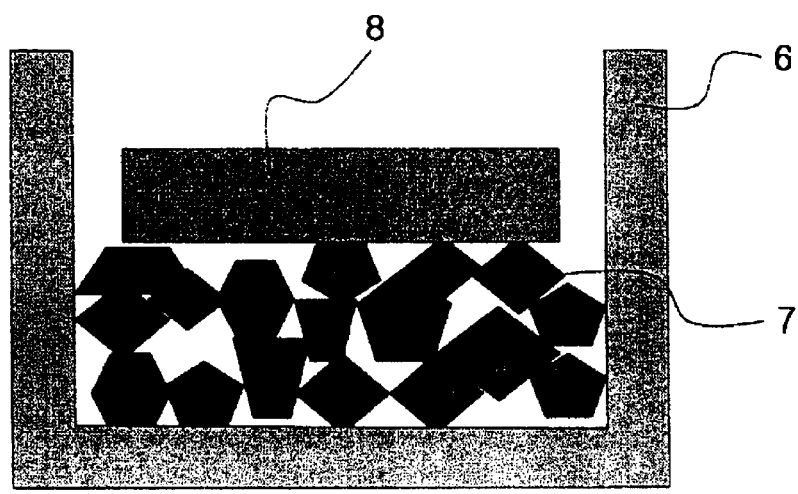
FIG. 2 illustrates a pressureless infiltration method for fabricating a metal matrix composite.
Figure 3:
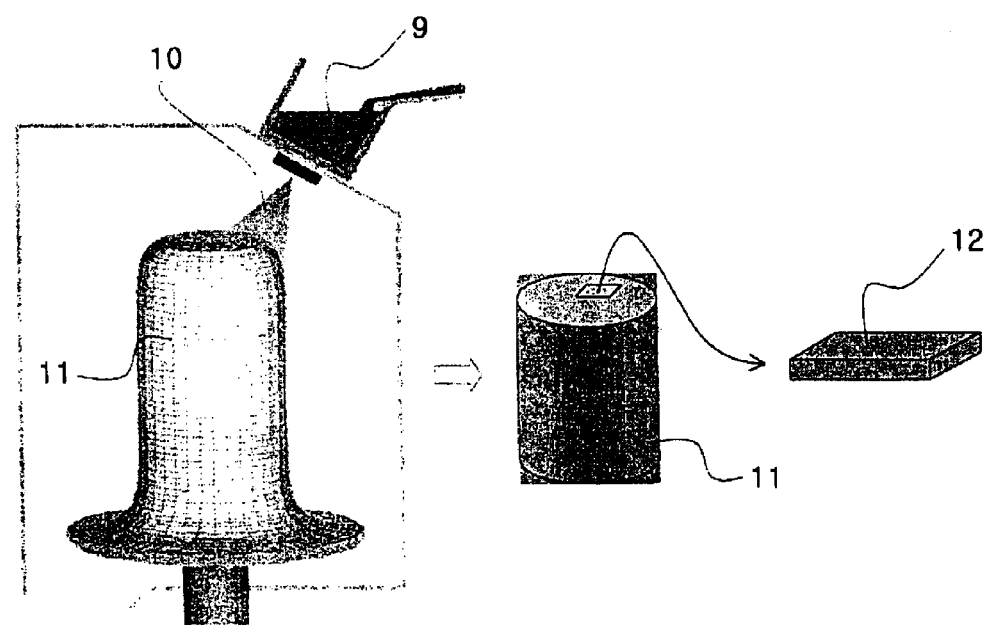
FIG. 3 illustrates the conventional Al—Si alloy packaging material fabrication method.
Figure 4:
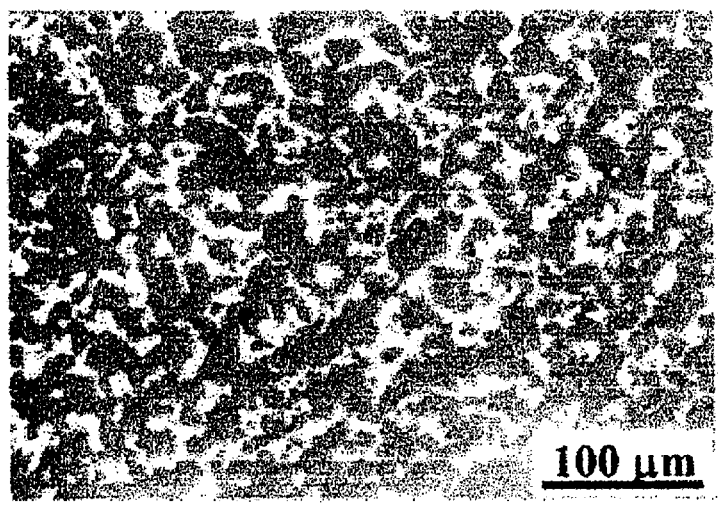
FIG. 4 is an enlarged photograph of Al-70Si alloy packaging material which is fabricated by the conventional spray forming method taken with an electronic microscope.
Figure 5:
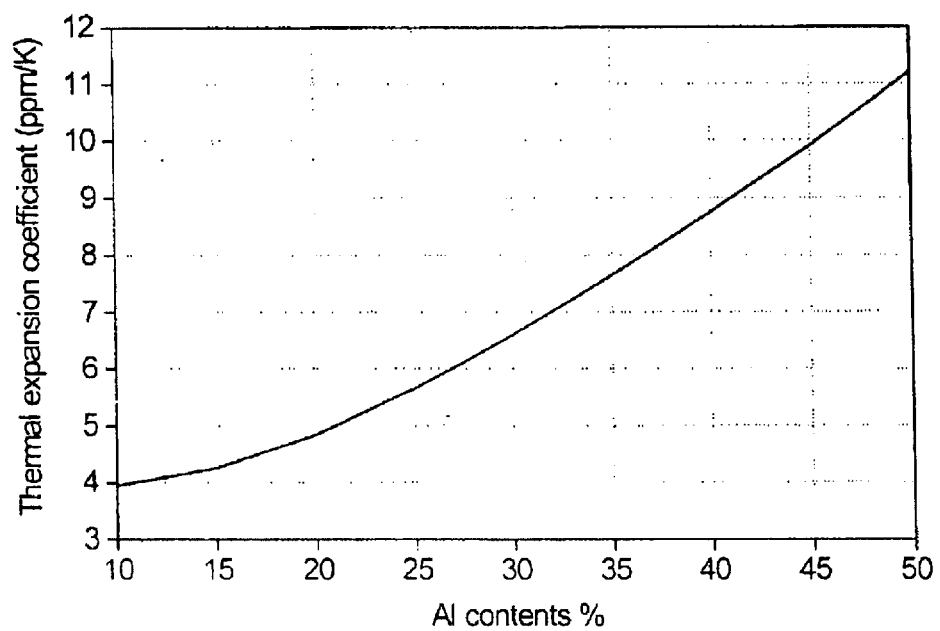
FIG. 5 is a graph illustrating a proportional relation between Al content and a thermal expansive coefficient.

In the fabrication method in accordance with the present invention, Si content in an Al—Si alloy material can be easily adjusted. As depicted in FIG. 5, the more Si content in an Al—Si alloy material, the lower a heat expansive coefficient is, and accordingly it is possible to design an Al—Si packaging material having a heat expansive coefficient similar to that of a semiconductor device.

In the present invention, it is possible to reduce internal air holes by fine-filling of powder. For example, in fabrication of a packaging material having Si content as 80 wt % by mixing Si powders with Al powders, because of excessive Si powders not having plastic deformation characteristics, it is difficult to perfomr fine-filling. However, in an embodiment of the present invention, by mixing-filling 60 wt % of Si powders with 40 wt % of Al-50 wt % Si alloy powders, herein, Al-50 wt % Si alloy powders efficiently fill spaces among particles of the Si powders, and accordingly a fine structure reducing internal air holes can be obtained.

In addition, in order to mix Si powders with Al—Si alloy powders uniformly, moisture of powders is eliminated before mixing or an addition is used. Due to insufficient flowability, powders having moisture can not be uniformly mixed. Accordingly, a heating process for heating powders for about 5 minutes~a hour at the temperature in the range of 50~500° C. by using an electric oven, etc. is used to eliminate moisture of powders, and accordingly powders can be easily mixed. A heating time is reduced or increased according to a quantity of powders. In more detail, by appropriately adjusting a heating time and a heating temperature, an optimum mixings can be performed.

Organic substances such as stearic acid, etc. can be used as the addition. The organic substance prevents static electricity occurrence and facilitates mixing of different kinds of powders. In a heating process after the mixing, the organic substance is emitted to the outside by oxidation or combustion, and accordingly it does not exist in the powder. It is preferable to add the addition (organic substance) in the range of 0.1~10 wt % on the basis of total weight of powders. Mixing is performed by filling raw materials with organic substance, vibrating and rotating them for 5 minutes~1 hour. The vibrating and rotating time can be shortened or extended according to a quantity of powders.

After the mixing, in order to fabricate a mixture body of Si powders and Al—Si alloy powders, pressure in the range of 10 MPa~500 MPa is applied, herein, in order to facilitate the fabrication, powders can be heated at a temperature in the range of 200° C.~500° C. or a current can be applied. Herein, an amplitude of the current is differentiated according to a size of a material. For example, in fabrication of a material having 2 cm diameter and 2 mm height, it is preferable to apply current in the range of 500~10000A. In general, in proportion to a size of a material to be obtained, amplitude of current is increased. And, a pressurizing time is in the range of 5 seconds~30 minutes.

The more a forming pressure, a heating temperature, a current and a pressurizing time, the more easily a preferable packaging material (having fewer internal air holes) can be fabricated. However, in consideration of a competitive price influenced by a production cost increase, it is preferable to adjust those conditions at an appropriate level.

Figure 6A:
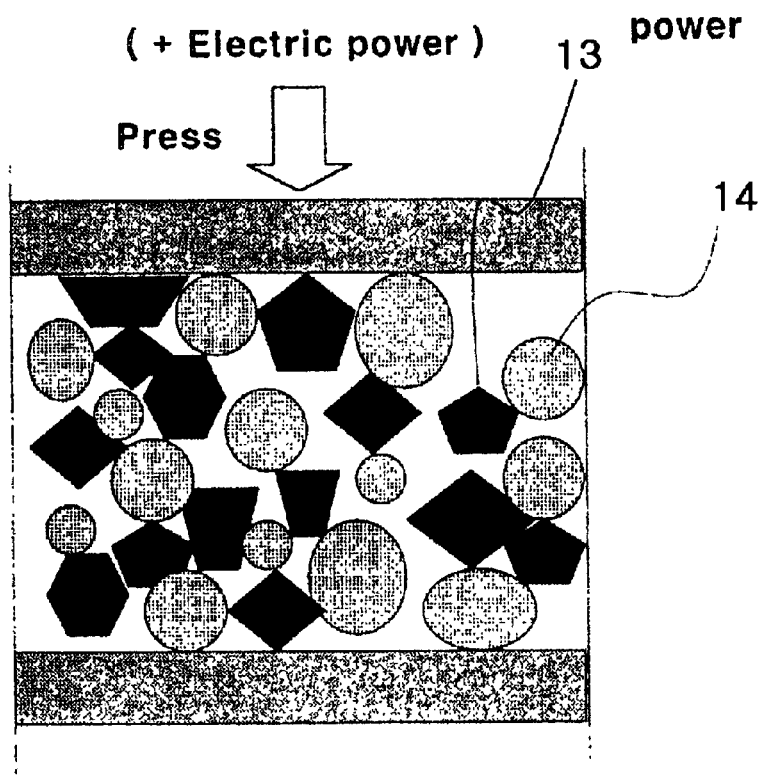
FIGS. 6a and 6b illustrate an Al—Si alloy fabrication method in accordance with the present invention.
Figure 6B:
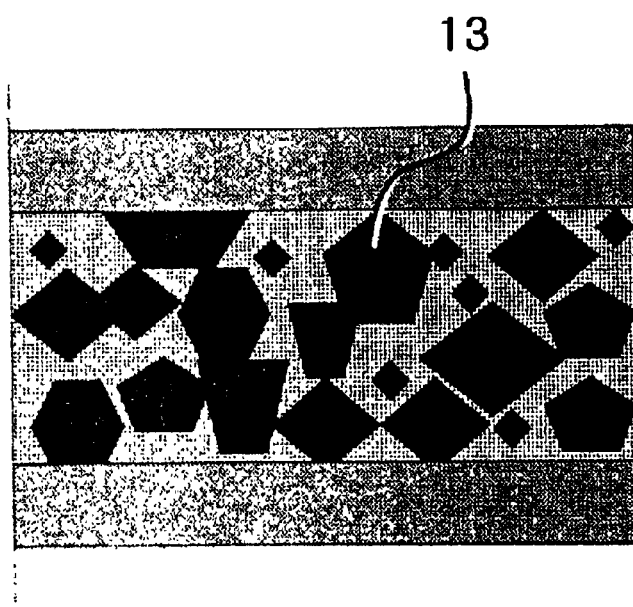
Figure 6C:
FIG. 6c is a photograph of Al—Si alloy packaging material which is fabricated by the method in accordance with the present invention taken with an electronic microscope.

When the powder mixture is heated, because deformability of Al—Si alloy powders is increased, the powder mixture can be easily deformed by applied stress. In addition, when current is applied, arc is generated at a contact surface between powders, powders are heated in an instant, melting phenomenon occurs in some cases, and accordingly the powder mixture can be easily compacted. FIGS. 6a~6c illustrate the above-described method. In order to obtain an Al—Si packaging material having an expecting Si content, after adjusting composition of Si powders 13 and Al—Si alloy powders 14, mixing is performed. Herein, current is applied while pressurizing-forming the mixture. Plasma arc due to electric current occurs, and accordingly an Al—Si alloy packaging material including the Si powders 13 is obtained as shown in FIG. 6b. FIG. 6c is a photograph of the Al—Si alloy packaging material taken with an electronic microscope. In FIG. 6c, Al is white, and Si is black.

In addition, in order to facilitate heating or current-apply of the powder mixture, by pressurizing the powder mixture for a certain time beforehand, a contact area of the powders can be increased.

Figure 7:
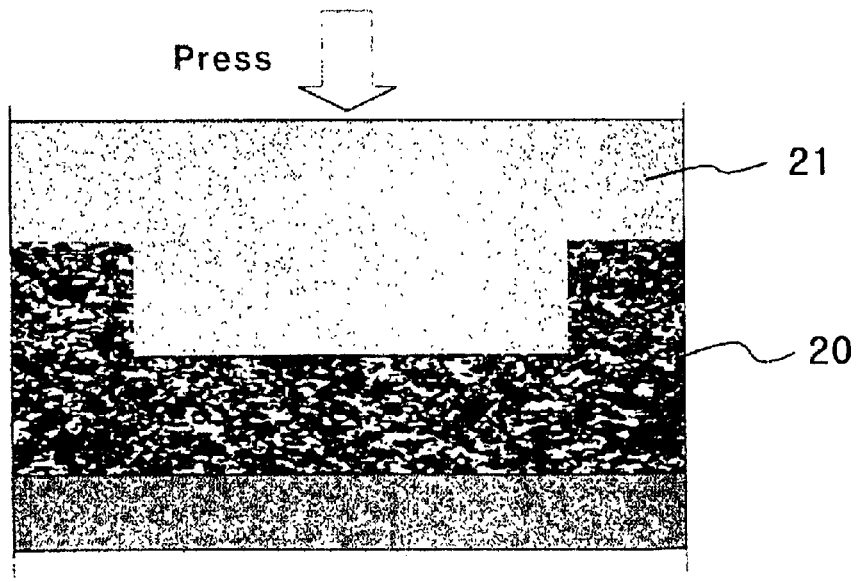
FIG. 7 illustrates a packaging material having a complicated shape fabricated by using a pressurized piston having an intricate shape.

As depicted in FIG. 7, by designing a shape of a piston 21 for pressurizing or applying current to the mixture 20 (of Si powders and Al—Si alloy powders) more precisely, a packaging material having a shape near a final packaging box can be directly fabricated.

Figure 8A:
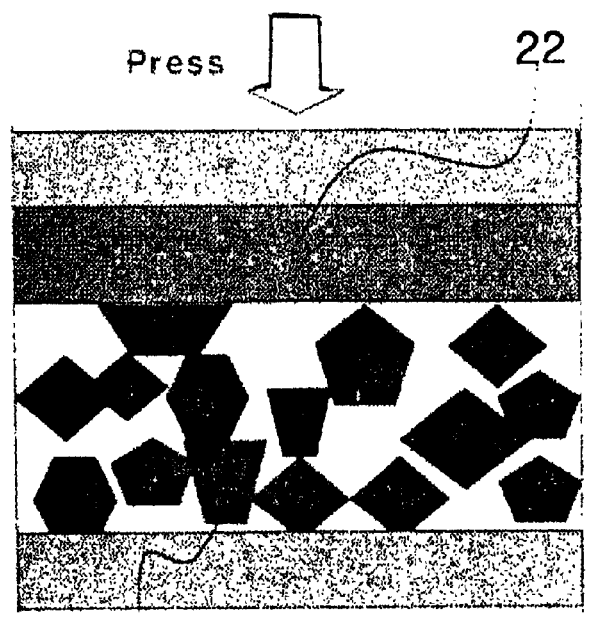
FIGS. 8a and 8b illustrate a method for penetrating Al—Si alloy melt directly into Si powders in accordance with the present invention.
Figure 8B:
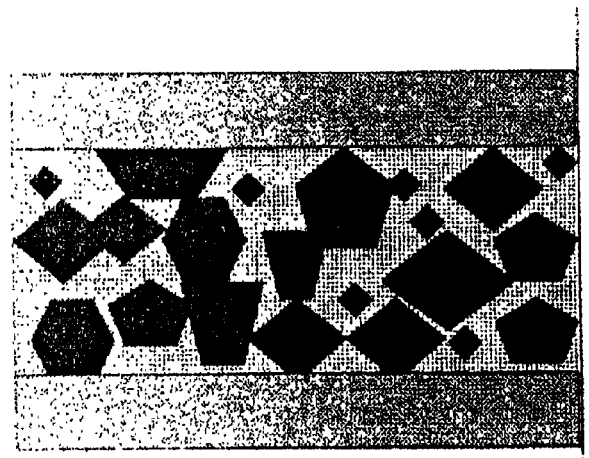
Figure 8C:
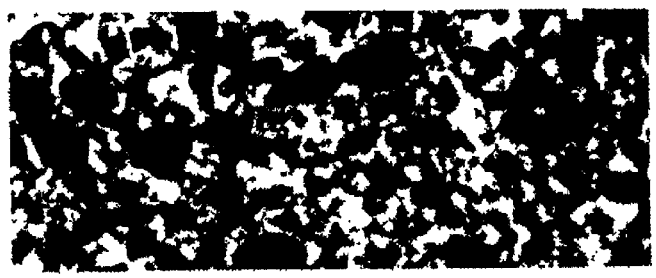
FIG. 8c is a photograph of Al—Si alloy packaging material which is fabricated by the method in accordance with the present invention taken with an electronic microscope.

In another embodiment of the present invention, as depicted in FIGS. 8a~8c, by directly pressurizing-filling the Si powders 13 with Al—Si alloy melt 22, an Al—Si packaging material (FIG. 8b) containing 40~90 wt % of Si can be fabricated.

Total Si content in a final Al—Si packaging material is calculated by following equation.

$$\text{Total Si content \%} = Y + \frac{y(100 - Y)}{100}$$

Herein, Y is wt % of Si powders and y is wt % of Si in Al—Si alloy melt. By adjusting composition of Al—Si alloy melt and a quantity of Si powders, total Si content in an Al—Si alloy packaging material can be varied. FIG. 8c is a photograph of the fabricated Al—Si alloy packaging material taken with an electronic microscope.

After forming Si powders as a preforming body having strength unbreakable by sintering in a vacuum state or under oxygen, nitrogen or argon, etc. circumstances, the preforming body is injected into the Al—Si alloy melt. In addition, in order to facilitate the melt injection, in other words, to prevent solidification of Al—Si alloy melt, the Si powders as it is or the preforming body is heated at a certain temperature. In more detail, the Al—Si alloy melt may be solidified while penetrating into the Si powder or the preforming body at a temperature below a certain temperature, in that case, progressing the penetration is impossible. In general, the certain temperature is in the range of 150~500° C. In the pressurizing-filling, pressure can be widely set in the range of 0.1~200 MPa, in some cases, penetration is performed only with a self weight (pressurization pressure 0) of the melt.

Figure 9:
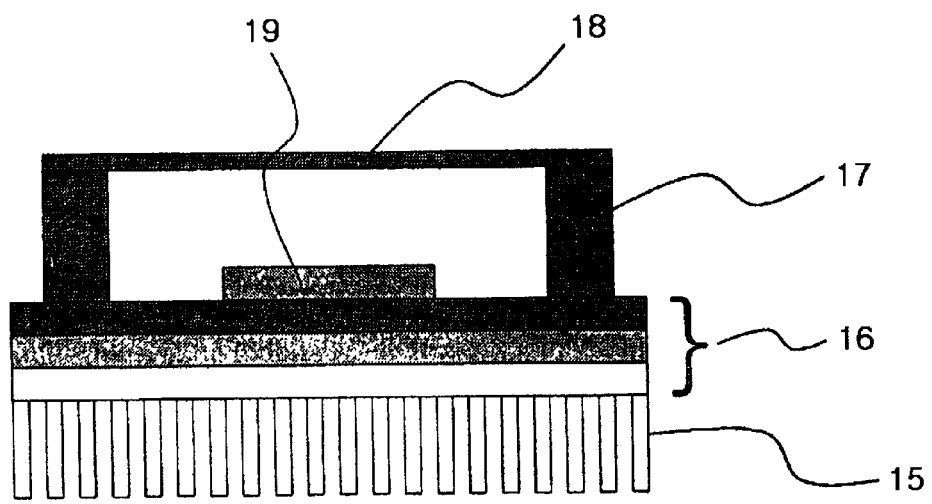
FIG. 9 illustrates a packaging material having Si content differently in the thickness direction thereof.

In yet another embodiment of the present invention, Si content can be differentiated in the thickness direction of the packaging material. FIG. 9 illustrates a box-shaped packaging material consisting of a base 16, a sidewall 17, a lid 18 and a cooling pin 15. Herein, the base 16 consists of layers of materials having different Si content. A semiconductor substance 19 is disposed in the box-shaped packaging material.

Advantages of the above-mentioned packaging material are as below. The more the Si content, the lower a heat expansive coefficient, and accordingly it is possible to reduce the dissection phenomenon between the casing and semiconductor device. However, as a heat conductivity is also lowered, it is impossible to emit heat generated in the semiconductor device efficiently. Therefore, in the packaging material, a side contacting to the semiconductor device has greater Si content in order to reduce a heat expansive coefficient, a substrate side or a cooling pin side has smaller Si content in order to improve a heat conductivity, and accordingly the dissection phenomenon between the packaging material and semiconductor device can be reduced, simultaneously heat generated in the semiconductor device can be efficiently emitted.

In the present invention, the Al—Si alloy powders or Al—Si alloy melt can include elements such as Cu, Mg and Zn below 5 wt %. The method in accordance with the present invention lower a melting point of the Al—Si alloy powders or improve the penetration characteristics or improve strength of a final packaging material by improving reactivity of the Si powders with a surface layer (oxide coating, etc.).

In addition, in the present invention, it is preferable for particles of the Si powders and the Al—Si alloy powders to have a size in the range of 5~500 μm, when a particle of the powders is not greater than 5 μm, it is difficult to fabricate and handle the powders, and minute particles can be harmful to human health. However, it is not required to remove stubbornly minute powders not greater than 5 μm generated in powder fabrication process such as a gas spray process and a crushing process, etc. In addition, when excessively gross powders are used, air holes can be easily formed in a final Al—Si material, and accordingly it is difficult to fabricate a product. It is not necessarily required to use uniform powders. In other words, by mixing powders showing a certain size distribution (having different sizes), powder's filling weight can be improved.

EXAMPLES

The present invention will be better understood from the below examples, but those examples are given only to illustrate the present invention, not to limit the scope of it.

Example 1

Figure 10:
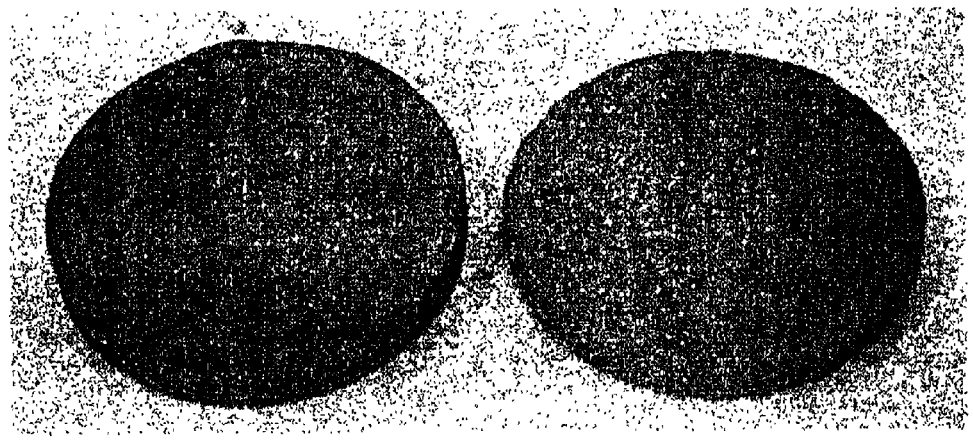
FIG. 10 is a photograph of an Al—Si alloy packaging material which is fabricated by the method in accordance with the present invention taken with an electronic microscope.
Figure 11:
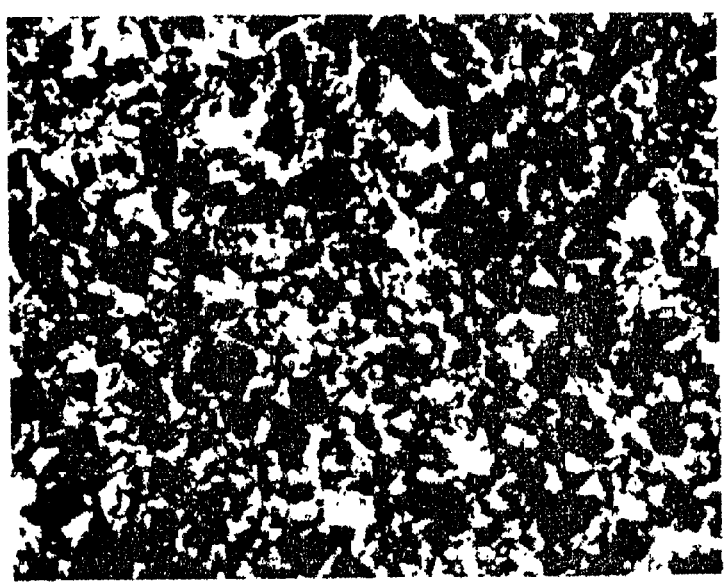
FIG. 11 is a photograph of an Al—Si alloy packaging material which is fabricated by the method (mixing Si powders with Al—Si alloy powders) in accordance with the present invention taken with an electronic microscope.

Si powders and gas-sprayed Al-10 wt % Si powders are mixed as the ratio of 2:1, the mixture is disposed in a circular die having 20 mm diameter, 2000A current is applied, simultaneously 3000 kg·f of pressure is applied, and accordingly an Al—Si alloy packaging material is fabricated. FIG. 10 illustrates the material. FIG. 11 is a photograph of the Al—Si alloy packaging material taken with an electronic microscope. Herein, Al is white, and Si is black.

Si content in the Al—Si alloy is $\frac{2}{3}(100)+\frac{1}{3}(100(0.19)=73\%$.

In the material, a heat expansive coefficient is about $6.4 \times 10^{-6}$/K (TMA 7, thermo-physical analyzer, PERKIM ELMER company), density is about $2.5 \times 10^3$ kg/m³ fd (calculated by dividing measured mass by volume), heat conductivity is 138 W/mK (calculated by maintaining a temperature at one portion uniformly and calculating a temperature at another portion). Therefore, the material shows good packaging material characteristics.

Example 2

Figure 12:
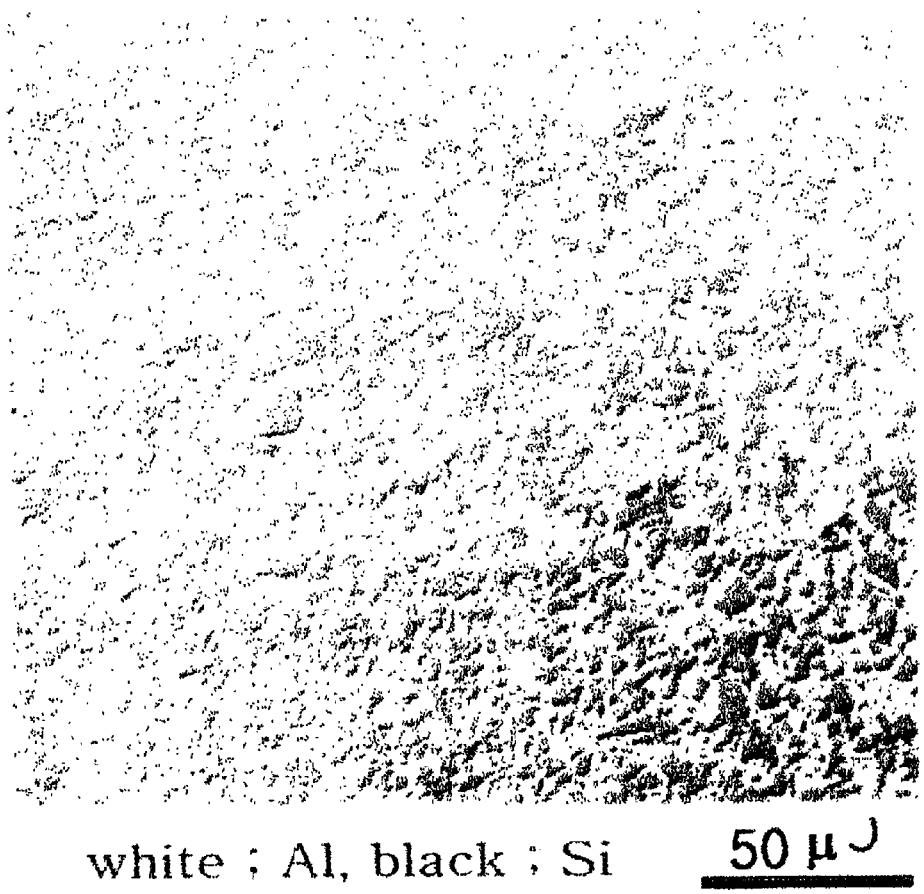
FIG. 12 is a photograph of an Al—Si alloy packaging material which is fabricated by the method (penetrating Al—Si alloy melt into Si powders) in accordance with the present invention taken with an electronic microscope.

Si powders are disposed in a container, and the container is heated at about 350° C. Al-18Si alloy melt is added to the Si powders, simultaneously pressure about 100 MPa is applied, and accordingly an Al—Si alloy packaging material is fabricated. FIG. 12 is a photograph of the Al—Si alloy packaging material taken with an electronic microscope.

As described above, in a method for fabricating an Al—Si alloy packaging material in accordance with the present invention, it is possible to simplify processes and lower a production cost in comparison with the conventional spray fabrication method. In addition, in the physical aspects, an Al—Si group alloy fabricated by the method in accordance with the present invention can stand comparison with the conventional semiconductor packaging material.

What is claimed is:

1. A method for fabricating a Si—Al alloy packaging material, comprising:

mixing Si powders with Al—Si alloy powders such that the total weight of Si, x plus y, is 40~90% by weight of the mixture, wherein x is the weight of Si powder and y is the amount of Si in the Al—Si alloy powder;

filling the mixture into a die having a certain shape; and pressurizing-forming the filled mixture.

2. The method of claim 1, wherein heat or current is applied to the mixture while pressurizing-forming it.

3. The method of claim 1, wherein a particle size of the Si powders and the Al—Si alloy powders is in the range of 5~500 μm.

4. The method of claim 1, wherein a Si—Al packaging material having a three-dimensional shape is directly fabricated by adjusting a pressurization-forming piston and a substrate's shape.

5. The method of claim 1, wherein the content of microelement such as Cu, Mg, Zn and Fe is below 5% by weight of the Al—Si alloy powders.

6. A method for fabricating a Si—Al alloy packaging material, comprising:

preparing a Si powders and Al—Si alloy mixture melt such that the total weight of Si, x plus y, is 40~90% by weight of a packaging material to be obtained, wherein x is the weight of Si powder and y is the amount of Si in the Al—Si alloy powder; and pressurizing-filling the Si powder with the Al—Si alloy melt in a die having a certain shape.

7. The method of claim 6, wherein a preforming body of the Si powders is fabricated by applying current and pressure in the range of 1~50 MPa.

8. The method of claim 7, wherein the preforming body is fabricated by sintering the Si powders in a vacuum state or under gas circumstances such as oxygen, nitrogen and argon, etc.

9. The method of claim 6 or 7, wherein the Si powders or the preforming body is heated at a temperature in the range of 150~500° C. to facilitate the penetration of the melt.

10. The method of claim 6 or 7, wherein a pressure is not greater than 1 atmospheric pressure in the pressurizing-filling in order to facilitate the penetration of the melt into the Si powders or the preforming body.

11. The method of claim 6, wherein a Si—Al packaging material having a three-dimensional shape is directly fabricated by adjusting a pressurization-forming piston and a substrate's shape.

12. The method of claim 6, wherein the content of microelement such as Cu, Mg, Zn and Fe is below 5% by weight of the Al—Si alloy melt.

* * * * *